United States Patent
Needle et al.

(10) Patent No.: US 6,323,654 B1
(45) Date of Patent: Nov. 27, 2001

(54) METHOD AND APPARATUS FOR REMOTELY CHANGING SIGNAL CHARACTERISTICS OF A SIGNAL GENERATOR

(75) Inventors: David L. Needle, Alameda; Stan F. Shepard, Oakland; Gary Gin, San Carlos, all of CA (US)

(73) Assignee: Jovial Test Equipment, Oakland, CA (US)

(*) Notice: Subject to any disclaimer, the term of this patent is extended or adjusted under 35 U.S.C. 154(b) by 0 days.

(21) Appl. No.: 09/652,424

(22) Filed: Aug. 31, 2000

Related U.S. Application Data

(62) Division of application No. 09/050,652, filed on Mar. 30, 1998, now Pat. No. 6,160,405.

(51) Int. Cl.[7] .................................................. G01R 31/10
(52) U.S. Cl. ........................................ 324/534; 324/533
(58) Field of Search .................................. 324/508, 517, 324/538, 539, 533, 503, 534

(56) References Cited

U.S. PATENT DOCUMENTS

| | | | | |
|---|---|---|---|---|
| 3,781,665 | * | 12/1973 | Gale | 324/533 |
| 4,862,491 | * | 8/1989 | La Salle et al. | 379/6 |
| 5,122,800 | * | 6/1992 | Philipp | 341/156 |
| 5,268,644 | * | 12/1993 | Klassen et al. | 324/503 |
| 5,444,695 | * | 8/1995 | Copley et al. | 370/452 |
| 5,726,578 | * | 3/1998 | Hook | 324/643 |

\* cited by examiner

Primary Examiner—Safet Metjahic
Assistant Examiner—Vincent Q Nguyen
(74) Attorney, Agent, or Firm—Thomas R. Lampe

(57) ABSTRACT

A detector and a variable signal generator are coupled so that one or more specific changes in the output of the detector will cause a change in the characteristics of the generated signal. This change in signal characteristics is non-transient, the change remaining in effect until such time that another change in the detector output causes another change in the signal characteristic. The system can provide remote-end positive wire identification with no additional instrumentation at the remote end. When this invention is embodied in an already existing piece of test equipment, such as a multimeter or time domain reflectometer, there need be no additional hardware instrumentation at either end.

1 Claim, 3 Drawing Sheets

METHOD AND APPARATUS FOR REMOTELY CHANGING SIGNAL CHARACTERISTICS OF A SIGNAL GENERATOR

This is a division of application Ser. No. 09/050,652, filed Mar. 30, 1998, now U.S. Pat. No. 6,160,405.

TECHNICAL FIELD

This invention relates to remote changing of the characteristics of a signal produced by a signal generator. This invention has particular application to locating or identifying one or more electrical conductors such as household wiring, commercial wiring, and industrial wiring installations. Examples of such wiring are TV coax and antenna wires, all types of electrical wires, telephone and data wires, environmental control wires, etc. No instrumentation is needed at the remote end of the wiring under test to effect the change in signal characteristic.

BACKGROUND OF THE INVENTION

Many devices exist that inject a signal onto a length of wire or pair of wires for the purpose of physically locating other parts of the length thereof. These devices are commonly called 'tone generators', even though these devices themselves only produce an electrical signal and a receiver functions to produce the actual audible tone. U.S. Pat. No. 5,457,441, for example, discloses a receiver of the inductive pick-up type which produces a tone when it picks up a signal. A receiver can be incorporated as part of a standard telephone test set or other common test equipment. Such a process is used when the location of one end of a cable or wire is known and the location of the other end is not known or is closely bundled with other cables or wires and can not be specifically identified.

To illustrate, consider the simple situation of a pair of wires isolated at one end and grouped with a few other pairs at the other end. The 'tone generator' is connected to the isolated end of the pair of wires and the receiver is placed near the group of wires at the other end. The receiver is positioned closely adjacent to each wire sequentially, and when the tone output of the receiver is loudest, one might reasonably conclude that the receiver is closest to the wire in question.

While this process often works well, it fails when the wires are in sufficient proximity for the injected signal to couple across to one or more of them. In that case, the tone output of the receiver is often equally loud when placed near many of the wires and identification is not possible. In the not so simple case where the known end of the wires is already bundled in a large quantity of wires, and this bundle along with other bundles are routed in close proximity for a long length, the process almost always fails, allowing a tone to be produced from the signal on many of the wires. While this failed process has often reduced the count of possible solutions, it sometimes does not.

The next process usually followed by the person interested in finding the wires is to individually test the wires by placing a short on the known end and measuring for that short on the possible unknown ends. This process requires that the person make several trips from one end of the wiring to the other. These trips can involve flights of stairs, or even be between buildings. This is clearly an inefficient process.

There exist expensive and complex devices that allow for the remote changing of the injected signal but require special instrumentation at the remote end. See, for example, the arrangement disclosed in U.S. Pat. No. 4,862,491. There are also remotely controllable signal generators that are used for the testing of telephone lines that require specific instrumentation at the remote end to affect that change in the signal generator. See, for example, U.S. Pat. No. 5,307,398. These existing methods and devices require specific and expensive pieces of test equipment that may be justified for use by test technicians, but are not generally in the possession of ordinary households. Yet, there exists in ordinary households the need to identify wires in the course of owner-performed home improvements or repair.

This invention provides a solution to the problem of positive identification of wires without regard to the characteristics of the wire type or the intended use of the wires, and with no additional instrumentation being required at the remote end. When appropriately implemented in a signal generator or detector employed in other types of equipment, such as multimeters or time domain reflectometers (TDR's), there is minimal or no additional cost to that signal generator or detector. This allows for the low cost inclusion of this wire location/identification capability in an existing piece of test equipment suitable for home or professional use.

DISCLOSURE OF INVENTION

This invention provides a method for changing the characteristics of the signal generated by a 'tone generator' when a detector coupled to that 'tone generator' detects a significant change in the impedance of the wire or pair of wires it is connected to. By using impedance change as the 'trigger' for the signal characteristic change, the user does not need any instrumentation at the remote end to effect the change. This impedance change can be accomplished by merely shorting and then opening the ends of the wire pair suspected to be the wire pair of interest. The resultant change in the 'tone generator' signal characteristics is non-transient; that is, the change remains in effect until such time that another change in the detector output causes another change in the signal characteristic.

An exemplary embodiment of this invention contains a versatile signal generator, an open/short detector, and a simple flip flop. These circuits are coupled such that whenever the detector output changes from short to open, it flips the state of the flip flop. The output of the flip flop controls one of the characteristics of the signal generator such as its frequency. Thus, in actual use, when the user first shorts and then opens a pair of wires connected to the device, the tone heard in the receiver will change and hold its changed frequency.

It is not necessary that the two conductors connected to the generator be of the same type or length, just that there be two conductors. When a single wire is involved, the other conductor could, for example, be earth ground, a water pipe, or any other common conductor available at both ends of the wire in question.

While this invention can be used in a stand-alone signal generator/detector whose sole purpose is to generate this tone signal and respond to indications from its detector, the preferred approach is to employ the invention in a more versatile device such as a multimeter or TDR that contains among other elements a versatile signal generator, a detector, and a control circuit that directs the operation of the device. In such a preferred embodiment, this invention can be implemented totally in the software of the control circuit at minimal or even no additional cost.

Note that many types of detection mechanisms can be used when practicing this invention, such as a multimeter to detect resistance or voltage, or a TDR to measure length or termination type (Open, Shorted, Terminated). Many types of signal generators and characteristics (frequency, duty cycle, tone pattern) can also be used. It is suggested that 'volume' not be utilized as a changeable characteristic since it is the inability of the process to distinguish relative signal strengths that causes the identification problem with respect to prior art devices in the first place.

Other features, advantages, and objects of the present invention will become apparent with reference to the following description and accompanying drawings.

MODES FOR CARRYING OUT THE INVENTION

Figure 1:
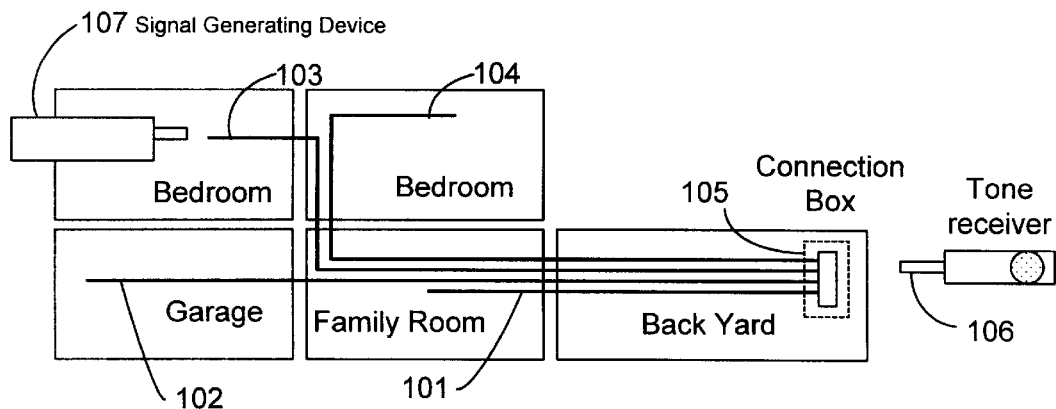
FIG. 1 is a drawing of a typical household cable system, the cable possibly being telephone, AC power, intercom, TV antenna or coax, alarm system, heater/air conditioning control, computer network, HiFi speaker wire, or any other general wire types.

FIG. 1 illustrates a simple, typical household wiring or cable installation. Each room is wired separately to a common connection box located in the back yard. Utilizing the principles of the present invention the installer could place the signal generator 107 on wire 103 in the upstairs front bedroom and then travel down to the back yard connection box 105. With his or her receiver 106, the individual could probe each of the four wires at that connection box to try and determine which of the cables extends from the upstairs front bedroom. When all four of the cables cause approximately the same tone indication (as would often be the case), he or she could then sequentially short and open each pair of wires until the characteristics of the tone change. At that point, there would be positive identification of the wire pair.

Figure 2:
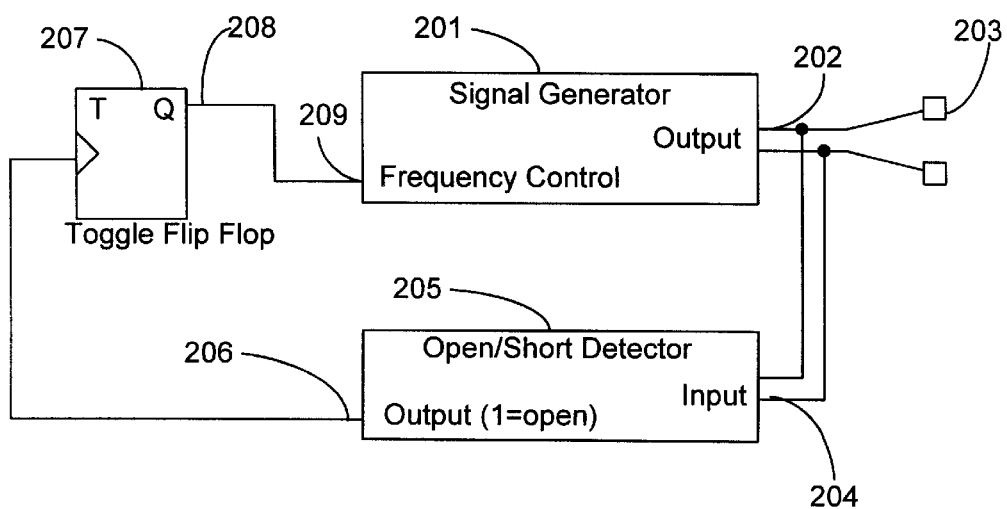
FIG. 2 is a drawing of a stand-alone embodiment or implementation of a signal generator incorporating this invention.

In FIG. 2, a stand-alone embodiment of the invention is illustrated. A versatile signal generator 201 couples its output 202 to the cable connection 203 and to the input 204 of the open/short detector 205. The detector 205 will set its output 206 to a logic 1 if it detects an open circuit at the cable connection 203, otherwise its output is logic 0. This detector output 206 is coupled to the clock input of toggle flip flop 207 such that every time the detector output changes from a logic 0 to a logic 1 the output 208 of the flip flop will change its state. This output 208 is coupled to the frequency control input 209 of the versatile signal generator 201.

The operation of this system will now be described. At any starting time, the output 208 of the flip flop is at some particular state, 1 or 0. Let us say it is at state 0. This causes the signal generator 201 to be generating a signal of the frequency that corresponds to that flip flop state of 0, for example 1000 Hz. When the user shorts the connection wires 203 by directly connecting them together or through the use of a common conductive tool like a screw driver, the detector 205 detects that short and changes its output 206 to a logic 0.

When the user removes the short circuit from the connection pins 203, the detector output 206 will change to a logic 1. This change to a logic 1 will cause the toggle flip flop 207 to change its output state to a logic 1. Now the signal generator will be outputting a signal of the frequency that corresponds to the flip flop state of 1, 2000 Hz for example. If the user then re-applies and then removes the short circuit from the connection pins 203, the detector output 206 will change to 0 and then to 1. This will once again toggle the flip flop and the output 208 of the flip flop will now be 0. This will cause the signal generator 201 to output the signal of frequency 1000 Hz, corresponding to the state 1 of the flip flop. Note that this particular implementation only has two states for the characteristic frequency of the signal generator. However this invention encompasses a device that has any number of characteristic states more than two.

Also, while this description shows the toggle flip flop 207 changing its state when its clock changes from 0 to 1, reflecting the detection of the removal of a short on wires 203, this invention also encompasses the situation where the flip flop 207 is of such a type that it changes its state when its clock changes from 1 to 0, reflecting the detection of a short on wires 203.

If this process is applied to the situation shown in FIG. 1, one can see that there will be no change in the receiver tone when shorts are applied to and removed from the wire pairs that do not have the signal generator attached, and there will be a change in the tone when a short is applied and removed from the one wire pair that does have the signal generator attached. This provides positive identification of the appropriate wire pair.

Figure 3:
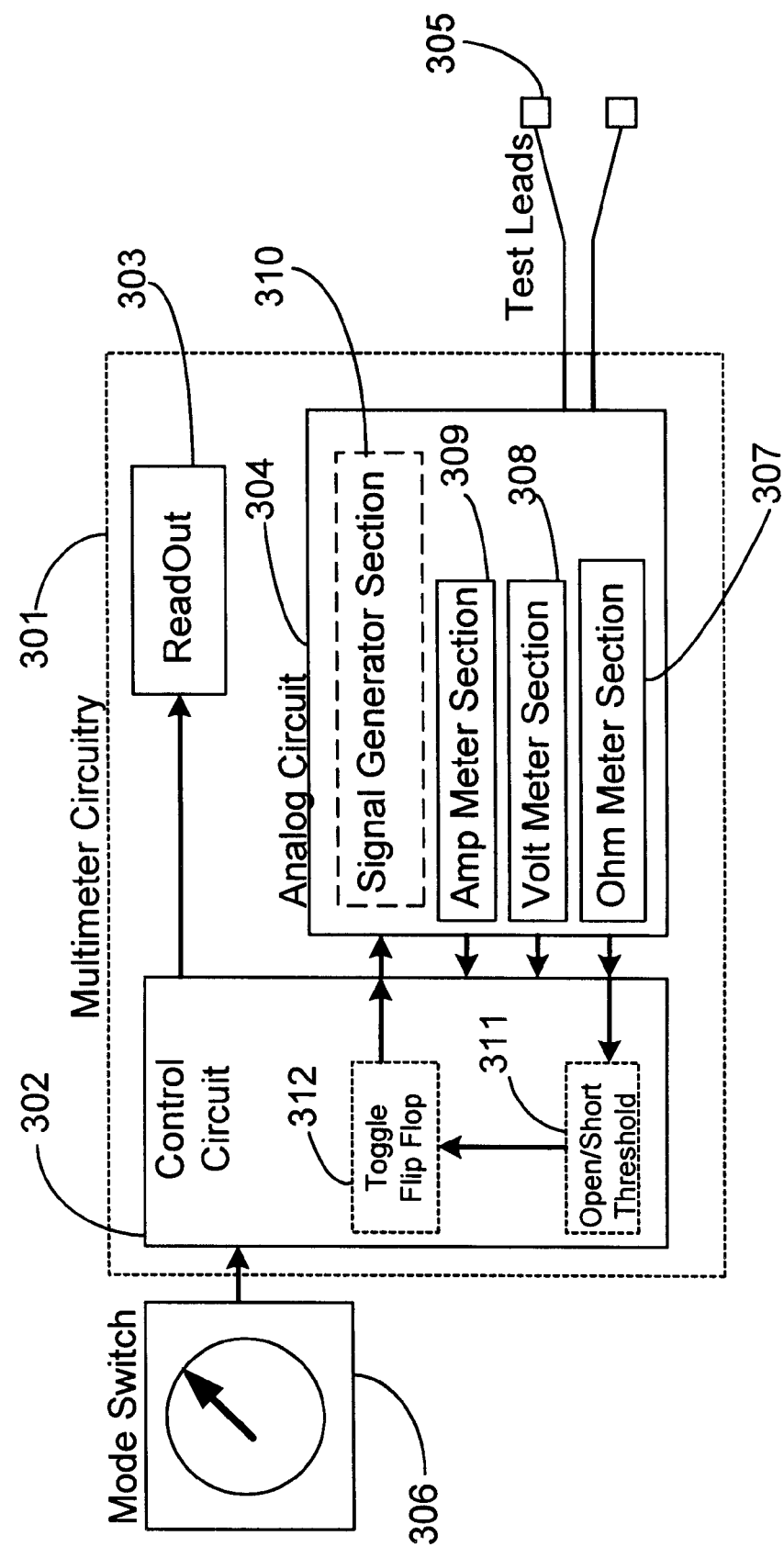
FIG. 3 is a drawing of an embedded hardware embodiment, with the signal generator and detector hardware inserted into a multimeter.

FIG. 3 shows a common multimeter with the addition of a versatile signal generator 310 to its analog circuit 304, and the addition of an open/short threshold detector 311 and toggle flip flop 312 to its control circuit 302. In the ordinary multimeter, the mode switch 306 is set by the user to the mode of operation desired, such as the measurement of Amps, Ohms or Volts. This mode switch 306 is read by the control circuit 302 which then sends appropriate control signals to the analog circuit 304. This analog circuit then performs the appropriate measurement of its environment via its test leads 305. The result of this measurement is sent back to the control circuit 302 where it is converted to the appropriate form for display on the readout 303.

In this embodiment of the current invention incorporated with a common multimeter, the mode switch 306 would have an additional position which, when read by the control circuit 302 would enable the output of the ohm meter section 307 to be examined by the open/short threshold detector 311 and a sufficiently low reading from the ohm meter section 307 would set the output of the detector 311 and toggle the flip flop 312. The changed state of the flip flop 312 is coupled to the signal generator 310 so as to change the specified characteristic of the signal generator 310.

In modern multimeters, the analog circuit 304 and the control circuit 302 are constructed with ASICs (Application Specific Integrated Circuit) and a small quantity of individual components. In some cases the two circuits are constructed within the same ASIC. It is a straightforward task for anyone skilled in the arts of multimeter design and ASIC design to include a versatile signal generator 310 in the analog circuit 304 and the open/short detector 311 and toggle flip flop 312 in the control circuit 302.

Figure 4:
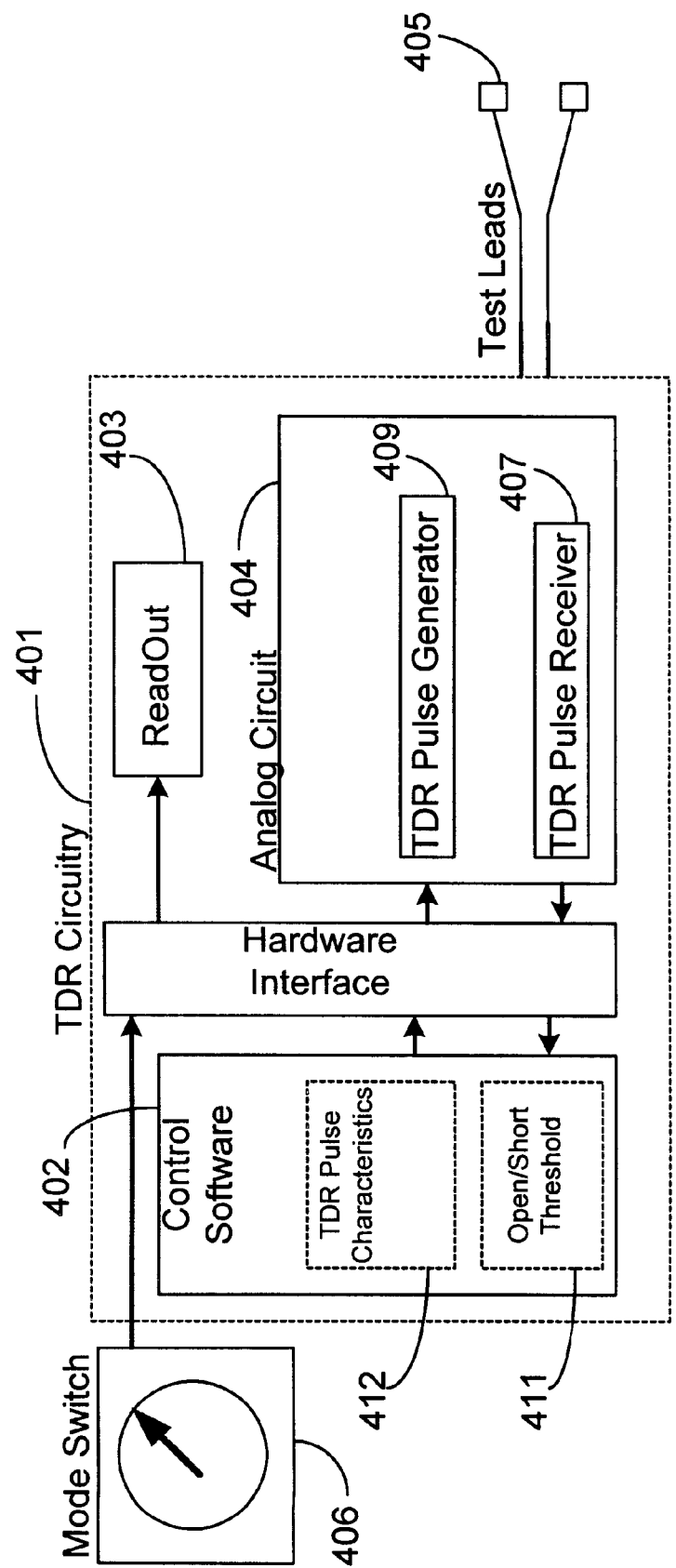
FIG. 4 is a drawing of an embedded software embodiment, with the invention contained completely within the control software of a TDR that already contains sufficient hardware to perform the functions of cable load detection and signal generation.

FIG. 4 shows an alternative embodiment wherein the invention is incorporated within a conventional TDR cable tester using only additional software and no additional hardware. In such an implementation, the cost of adding this new capability to the TDR could be virtually zero. In this implementation, the versatile signal generator already exists as the software controlled TDR pulse generator 409. The rate and pattern of repetition of the TDR pulse is already under the control of the control software 402.

The detector also already exists as the TDR pulse receiver 407 and TDRs already have open/short threshold software 411 as part of their capability. All that would be needed is additional control software to monitor the state of the open/short threshold logic 411 and change the appropriate characteristic of the TDR pulse generator 409 when the open/short state changes from short to open. Such software can readily be devised by one skilled in the TDR art. The appropriate pulse generator changeable characteristic could, for example, be the TDR pulse width, the pulse repetition rate, or the pulse repetition pattern.

What is claimed is:

1. Apparatus for connection to electrical conductor means at a first location on the electrical conductor means for locating or identifying the electrical conductor means at a second location on said electrical conductor means without introducing a signal into said electrical connector means at said second location, said apparatus comprising in combination:

versatile signal generator means comprising a time domain reflectometer pulse generator for connection to electrical conductor means at a first location on the electrical conductor means and capable of producing different signal characteristics;

detector means comprising a time domain reflectometer pulse receiver operatively associated with said versatile signal generator means at said first location for detecting a change in the load impedance of said electrical conductor means created at a second location spaced from said first location; and control means for receiving signals from said detector means at said first location and responsive thereto to change the characteristics of the signal produced by said versatile signal generator means at said first location responsive to the change in load impedance created at said second location, said change in the characteristics of said versatile signal generator means being non-transient, said control means including software for controlling the application of control signals from said control means to said versatile signal generator means.

* * * * *